United States Patent [19]
Dobele et al.

[11] Patent Number: 5,570,175
[45] Date of Patent: Oct. 29, 1996

[54] METHOD FOR DETERMINATION OF DEGREE OF MOLECULAR DISSOCIATION IN PLASMA USING COMBINED ELECTROSTATIC MEASUREMENT AND EMISSION SPECTROSCOPY

[75] Inventors: Frieder Dobele, Essen, Germany; William G. Graham, Coleraine, Northern Ireland; Denis P. Dowling, Blackrock; Terence P. O'Brien, Dublin, both of Ireland; Volkhard Kornas, Essen, Germany; Thomas Morrow, Templepatrick, Northern Ireland

[73] Assignee: Ceram Optec Industries Inc., East Longmeadow, Mass.

[21] Appl. No.: 511,014

[22] Filed: Aug. 3, 1995

Related U.S. Application Data

[63] Continuation of Ser. No. 209,073, Mar. 7, 1994, abandoned.
[51] Int. Cl.$^6$ .............................. G01N 21/00; G01J 3/30; G01R 27/22
[52] U.S. Cl. ........................... 356/72; 356/316; 324/73.1; 324/92; 324/96
[58] Field of Search .................... 356/72, 316; 324/73.1, 324/92, 96

[56] References Cited

U.S. PATENT DOCUMENTS

| | | | |
|---|---|---|---|
| 3,692,410 | 9/1972 | Jurany et al. | 356/72 |
| 4,198,160 | 4/1980 | Kachel et al. | 356/72 |
| 4,348,107 | 9/1982 | Leif | 356/72 |
| 4,462,962 | 7/1984 | Baba et al. | 356/72 |

Primary Examiner—Frank Gonzalez
Assistant Examiner—Jason D. Eisenberg
Attorney, Agent, or Firm—Bolesh J. Skutnik

[57] ABSTRACT

A new method is described that allows determination of the degree of molecular dissociation based on continuous, radio frequency (rf) and microwave driven discharges based on electrostatic probe and emission spectroscopy measurements only. Using this method costly laser-induced fluorescence spectroscopy (LIF) can be avoided. The method described is particularly applicable to hydrogen plasmas characterized by non-thermal electron energy distribution functions which are of great practical importance. A compact combined fiber optic/electrostatic probe facilitating the required measurements is described.

6 Claims, 1 Drawing Sheet

METHOD FOR DETERMINATION OF DEGREE OF MOLECULAR DISSOCIATION IN PLASMA USING COMBINED ELECTROSTATIC MEASUREMENT AND EMISSION SPECTROSCOPY

This is a continuation of application Ser. No. 08/209,073, filed Mar. 7, 1994 now abandoned.

BACKGROUND OF THE INVENTION

1. Field of the Invention

The present invention involves a method for determination of degree of molecular dissociation in plasma using combined techniques of electrostatic measurement and emission spectroscopy.

2. Information Disclosure Statement

Continuous plasmas produced by direct current, radio frequency (rf) or microwave generators are becoming increasingly important. Such plasmas can be used to coat, clean or modify the surfaces of metals, ceramics, glasses and plastics. All these technical processes work best under certain well defined parameters such as pressure, input power and gas composition.

One particularly important plasma parameter and the one addressed by this patent is the degree of dissociation of the gas molecules. Currently this parameter is determined non-invasively by measuring the fluorescence response signal resulting from laser excitation of the plasma. Selecting the laser wavelength essentially allows the selective excitation of characteristic transitions in atoms, molecules and radicals of interest. The observed subsequent fluorescence at emission wavelengths characteristic of the species allows the determination of the degree of dissociation. However this technique requires expensive lasers and optical equipment. Emission spectroscopy is a well understood and comparatively cheap technique which is used extensively to obtain information on the chemical species present in plasmas. Electrostatic probes are also used mainly in research devices to obtain information on the electron energy distribution function (EEDF) in plasmas and are also well understood and comparatively cheap.

The EEDF can be measured using an electrostatic probe technique. The probe consists of a small piece of metal, usually cylindrical, which is exposed to the plasma. As a voltage is applied to this probe, the current collected from the discharge can be related to the energies of the charged species present. From an analysis of this current-voltage (I-V) characteristic many of the plasma parameters can be determined, including the EEDF. This type of analysis can now be automated, both the collection of the I-V characteristic and its interpretation to obtain the plasma parameters and EEDF (mainly the calculation of the first and second derivative), [Hopkins and Graham 1986].

In general, the use of an electrostatic probe in a continuously operating plasma is straight forward. In rf driven discharges care must be taken to ensure that the rapid time dependant changes in the plasma potential do not influence the measurement. There is a recent thorough review of the problems of measuring EEDF's in rf discharges, [Godyak et al. 1992].

For operation in rf discharges we propose the use of a compensated probe technique. Here, an ac voltage derived from the plasma is applied to the probe to compensate for the voltages generated by the radio frequency, including fluctuations. The measurement and analysis of the I-V characteristic is then the same as in continuously operated discharge.

It should be noted that most plasmas of technical interest today have non-thermal (non-Maxwellian) EEDF's and mean electron energies in the range 0.5 to 2 eV. This is much lower than the 10 eV typically required to cause significant dissociation of molecular species. For these plasmas, neither emission spectroscopy nor electrostatic probes provides quantative information on the degree of dissociation of the molecular species.

SUMMARY OF THE INVENTION

It is, therefore, the object of this invention to provide a convenient and inexpensive method for the determination of the degree of dissociation of $A_x B_y$ molecules in a plasma, (wherein, A and B are any chemical elements and x and y are any positive integers including wherein one x and y may be zero) based on combined electrostatic probes and emission spectroscopy techniques only. Previously determined cross-sections for electron dissociation of the molecular species of interest are required for the calculation of the degree of dissociation from the spectroscopic and probe data. This information is available in the literature in each specific case. This combination of techniques is of particular interest as the two techniques are already used in many cases to determine other plasma parameters. In the general case, the imaging of the radiating plasma onto the emission spectroscopic instrument through windows in the discharge vessel only yields line of sight integrated information which can be reduced to local measurements only in rare cases of rotational symmetry or by multi-angular observation applying tomographic methods, again a technique of extreme complexity.

It is thus a further object of the present invention to describe a probe that allows the penetration into the plasma and the determination of both emission spectra and electrostatic potential at well defined locations within the plasma. One possible arrangement for making these measurements is an optical fiber system which will detect radiation according to its acceptance angle and entrance cross section thus giving less weight to radiation contributions originating at more distant locations in the plasma. Moving the probe across the plasma will therefore allow local information on the plasma to be deduced after deconvolution with the weighting function of the fiber which can be measured independently. This in turn will, by the method described herein, allow the determination of the degree of dissociation at locations which are of most interest particularly close to the substrate surface.

BRIEF DESCRIPTION OF THE DRAWINGS

The present invention is more fully understood when the instant specification is taken in conjunction with the drawings which are appended hereto, wherein.

DETAILED DESCRIPTION OF THE PRESENT INVENTION

Figure 1:
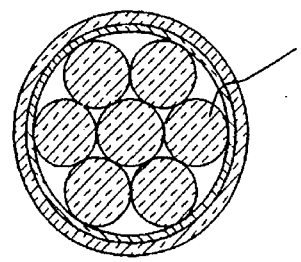
FIG. 1 shows an end cut view of a present invention probe and FIG. 2 shows a partial side view thereof.

The invention consists in the application of a combined Langmuir probe and spectroscopic measurements, performed by a single probe containing a metallic (Langmuir)

and an optical fiber (spectrum) sensor part, able to be inserted and moved across the plasma and to record both spatially resolved electron energy distributions and spectral lines of both the molecular and the atomic plasma component, information from which the degree of dissociation can be inferred. The practical application of the inventions may be more easily understood by considering the important case of hydrogen plasmas. Plasmas containing high concentrations of hydrogen are interesting for diamond and diamond-like carbon film deposition on various substrates and are currently attracting a tremendous amount of interest.

Emission spectroscopy in the visible part of the spectrum provides information on the population of energy levels with excitation energies greater than 10 eV. This applies in particular to hydrogen plasmas both for the prominent molecular lines and the Balmer lines of the atomic spectrum.

In continuous, rf and microwave discharges of technical interest the mean electron energy is however, much lower than 10 eV, with values around 0.5 to 2 eV in most cases. Nevertheless, emission lines in observed spectra demonstrate that energetic electrons are present in these discharges as well. Only if the existence of Maxwellian energy distribution for electrons is guaranteed, can the degree of dissociation be directly inferred from spectroscopic measurements alone by using cross-sections published in the literature and following the steps outlined below. The assumption of a Maxwellian distribution is very often not justified and even small relative portions of non-thermal electrons in the "tail" of the Maxwellian distribution can completely change the relative line intensities because the main bulk of the Maxwellian part is not involved in the population dynamics and the non-thermal portion is competing with the very small relative electron content of the tail of the thermal fraction.

For this reason, a detailed knowledge of the high energy part of the electron energy distribution function (EEDF) is required even in cases where rough estimates would indicate that a Maxwellian distribution for electrons is reasonable.

Data from the electrostatic probe is analyzed up to an energy of 100 eV to yield the EEDF from which the Maxwellian (thermal) and non-Maxwellian (non-thermal) contributions are determined. The probe and spectroscopic data are combined as follows to yield the degree of dissociation of the molecular species:

On the basis of the energy-dependant emission cross-sections for the Fulcher alpha bands (Moehlmann and de Heer, 1976), the corresponding photon rate is found by convolution of the cross-section with the probe measured EEDF. The analogous procedure is performed for the Balmer-alpha line (or any other atomic hydrogen line) taking account of all important excitation channels with pertinent cross-sections (Moehlmann, de Heer and Los, 1977; Johnson, 1972; Park, 1971). Since the former photon flux is proportional to the molecular hydrogen concentration and the second contains two contributions, the first being proportional to the molecular and the second to the atomic concentration, the degree of dissociation can be derived by simple mathematical manipulation.

In order to compare the photon flux rates involved, the spectroscopic detection system has to be spectrally calibrated in an independent measurement. These data are then sufficient to determine the degree of dissociation of the molecular species.

Figure 2:
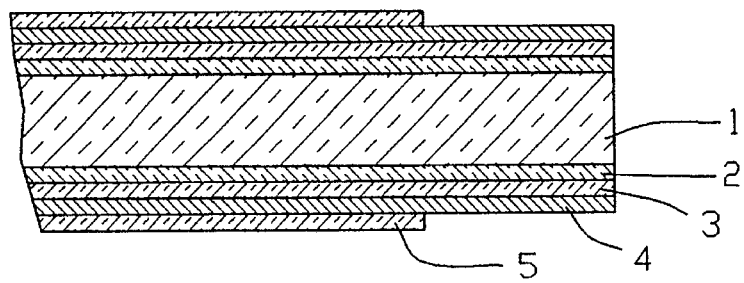
Figure 3:
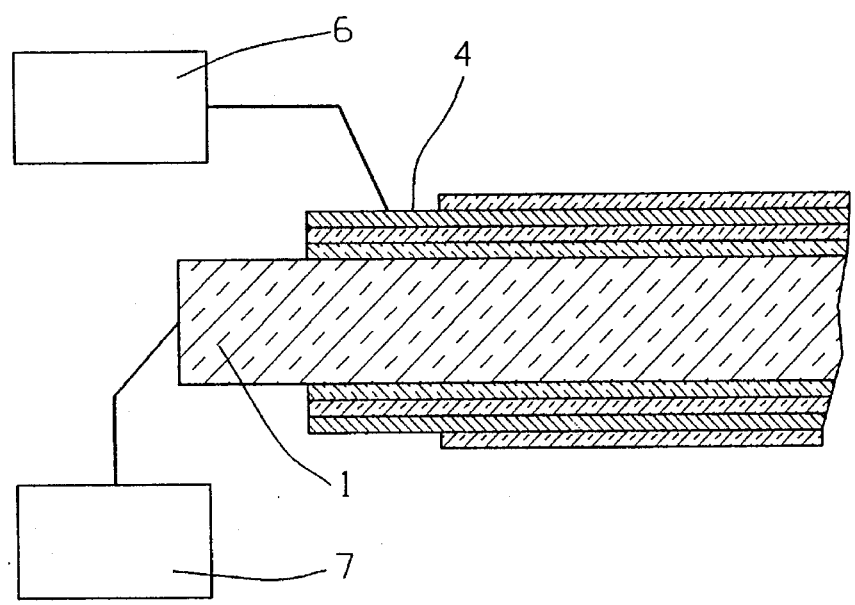
FIG. 3 shows the present invention probe connected to a spectrometer input port and a power supply.

The probe proposed for the simultaneous collection of spectroscopic and electrostatic data is illustrated in FIGS. 1, 2 and 3. The probe consists preferably of one or more optical fibers with a pure $SiO_2$ core (1) and fluorinated $SiO_2$ cladding (2). The cladding is then coated with an initial layer of polyamide (e.g. DuPont de Nemours XYZ), with a thickness of approximately 10 μm (3). This polyamide can withstand temperatures of up to 400° C. and is chemically inert to most acids and solvents. A thin (approx. 10 μm) metallic conductor (4) is then applied (by for instance sputtering) to this initial polyamide layer and a final layer of polyamide (5) shields the probe electrically from the surrounding, except for a region approximately 10 mm long on the end that leaves the metal conductor exposed to facilitate electrostatic measurements. The probe end is preferably concave to enhance light collection for spectroscopic analysis. The other end of the probe is equipped with a fiber optic connector (commercially available SMA or ST-type) to be connected to a spectrometer input port (7). Before this connector end an electrical branch-off is provided, together with a suitable cable and electrical connector for connection to a power supply (6) and associated electronic equipment.

In one embodiment, the probe consists of a round bundle of a number of smaller fibers in a dense packed (e.g. 7 fibers of 200 μm core diameter each) arrangement, a coating similar to that described above may be used. The cross section of such a bundle may then be transformed to a line arrangement before the connector end, thus enhancing the coupling efficiency to the spectrometer slit.

In some applications where probe contamination is a problem, the probe may have to be heated by electrical biasing and allowing electron bombardment to white hot temperatures. In this case a separation of the probe for the electrostatic measurements and the optical fibers for the emission spectroscopy measurement system may be required.

The method employs a computer controlled scanning spectrometer, scanning the relevant parts of the spectrum and making the necessary corrective calculations as well as intensity integrations over the various spectral regions. The electric connector of the probe described above is connected to the power supply and to the computer via the necessary compensation installation described above.

Obviously, numerous modifications and variations of the present invention are possible in light of the above teachings. It is therefore understood that within the scope of the appended claims, the invention may be practiced otherwise than as specifically described herein.

What is claimed is:

1. A method for analyzing a plasma with a combination probe comprising:

a. measuring electrostatic parameters of said plasma, region by region, using a electroconductive means within said combination probe;

b. measuring emission spectroscopic parameters of said plasma, region by region, substantially simultaneously with said electrostatic measurements wherein said emission spectroscopic measurements use at least one optical fiber within said combination probe to transfer emitted light signals to a means for detection and, if desired, storage of said light signal; and c. producing from said measurements for each region of said plasma a degree of dissociation of $A_xB_y$ as determined by a ratio of dissociated molecular fragments to undissociated molecules of species $A_xB_y$ present in said plasma, wherein said plasma has an electron energy distribution, A and B are any chemical elements, x and y are any positive integers including wherein one of x and y may be zero.

2. The method according to claim 1, further comprising:

determining that said species $A_xB_y$ is $H_2$, hydrogen gas, wherein said ratio of dissociated molecular fragments to undissociated molecules is $nH/mH_2$, wherein nH represents how many H atoms/ions are present in a plasma region, and $mH_2$ represents how many undissociated $H_2$ molecules are present in said plasma region.

3. The method according to claim 2, said method further comprising:

measuring electrostatic parameters and emission spectroscopic parameters for a plasma region having a non-thermal electron energy distribution, and combining said measurements from non-thermal distribution regions with measurement data from thermal distribution regions to characterize said ratio for said plasma.

4. The method according to claim 2, further comprising:

measuring sensitivities of said emission spectroscopic parameters as to their wavelength dependence;

determining an electron energy distribution function, n(E), from electrostatic measurements;

determining said ratio as given by integrals $J^F$, $J^A$ and $J^M$;

determining said integrals from known cross sections, from said electron energy distribution function, n(E), and from said wavelength dependent sensitivities of said emission spectroscopic parameters, wherein $J^F$ is the energy dependent cross section for the emission of Fulcher band light from hydrogen molecules integrated over said measured electron energy distribution function, $J^A$ is the energy dependent cross section for the emission of Balmer-alpha light directly from hydrogen atoms integrated over said measured electron distribution function, $J^M$ is the energy dependent cross section for the emission of Balmer-alpha light from hydrogen atoms produced from dissociation hydrogen molecules integrated over said measured electron energy distribution function.

5. The method according to claim 1, said method further comprising:

measuring electrostatic parameters and emission spectroscopic parameters for a plasma region having a non-thermal electron energy distribution, and combining said measurement from non-thermal distribution regions with measurement data from thermal distribution regions to characterize said ratio for said plasma.

6. The method according to claim 5, further comprising:

measuring sensitivities of said emission spectroscopic parameters as to their wavelength dependence;

determining an electron energy distribution function, n(E), from electrostatic measurements;

determining said ratio as given by integrals $J^F$, $J^A$ and $J^M$;

determining said integrals from known cross sections, from said electron energy distribution n(E), and from said wavelength dependent sensitivities of said emission spectroscopic parameters, wherein $J^F$ is the energy dependent cross section for the emission of Fulcher band light from hydrogen molecules integrated over said measured electron energy distribution function, $J^A$ is the energy dependent cross section for the emission of Balmer-alpha light directly from hydrogen atoms integrated over said measured electron distribution function, $J^M$ is the energy dependent cross section for the emission of Balmer-alpha light from hydrogen atoms produced from dissociating hydrogen molecules integrated over said measured electron energy distribution function.

\* \* \* \* \*